(12) United States Patent
Yedinak et al.

(10) Patent No.: US 6,798,019 B2
(45) Date of Patent: Sep. 28, 2004

(54) IGBT WITH CHANNEL RESISTORS

(75) Inventors: Joseph A. Yedinak, Mountaintop, PA (US); Dwayne S. Reichl, Pocono Lake, PA (US); Jack E. Wojslawowicz, Bayonne, NJ (US); Bernard J. Czeck, Mocanaqua, PA (US); Robert D. Baran, Plains, PA (US); Douglas Lange, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/055,211

(22) Filed: Jan. 23, 2002

(65) Prior Publication Data

US 2003/0137015 A1 Jul. 24, 2003

Related U.S. Application Data

(60) Provisional application No. 60/349,524, filed on Jan. 18, 2002.

(51) Int. Cl.[7] ............................................. H01L 29/73
(52) U.S. Cl. ..................... 257/341; 257/341; 257/578; 257/579; 257/580; 257/592; 257/401; 257/139
(58) Field of Search ................................ 257/401, 582, 257/341, 164, 526, 566, 539, 552, 557, 562, 563, 578, 579, 580, 583, 584, 560, 592, 139; 438/338, 203, 201, 204, 202, 279, 268, 234, 313, 322, 323, 325

(56) References Cited

U.S. PATENT DOCUMENTS

| | | | | |
|---|---|---|---|---|
| 5,119,153 A | * | 6/1992 | Korman et al. | 257/341 |
| 5,644,150 A | * | 7/1997 | Iwamuro | 257/147 |
| 6,060,744 A | * | 5/2000 | Kuwahara et al. | 257/328 |
| 6,437,419 B1 | * | 8/2002 | Bhalla et al. | 257/582 |
| 6,492,663 B1 | * | 12/2002 | Blanchard | 257/164 |

* cited by examiner

Primary Examiner—Jerome Jackson
Assistant Examiner—Matthew C Landau
(74) Attorney, Agent, or Firm—Thomas R. FitzGerald, Esq.; Laurence S. Roach, Esq.

(57) ABSTRACT

An IGBT has striped cell with source stripes 2a, 2b continuous or segmented along the length of the base stripe 3. The opposite stripes are periodically connected together by the N+ contact regions 20 to provide channel resistance along the width of the source stripes 2a, 2b. For continuous stripes the resistance between two sequential contact areas 20a, 20b is greatest in the middle and current concentrates near the source contact regions 20. The wider the spacing between the contacts 20, the larger the resistive drop to the midpoint between two N+ contacts 20.

12 Claims, 15 Drawing Sheets

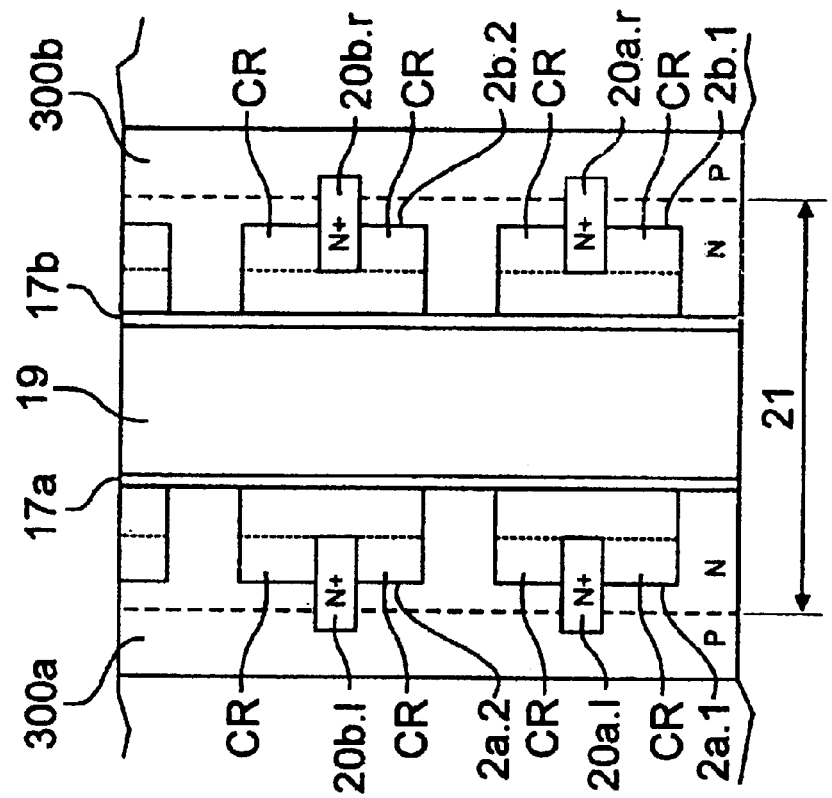
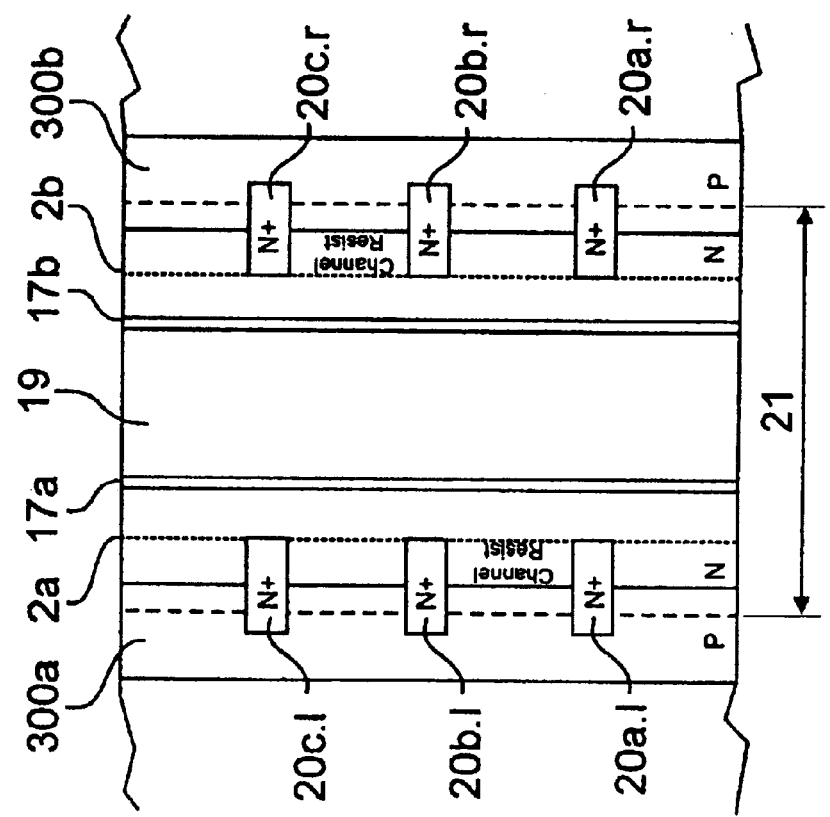
Fig. 16
Fig. 15

IGBT WITH CHANNEL RESISTORS

CROSS-REFERENCE TO RELATED APPLICATIONS

This application claims the benefit of U.S. Provisional Patent Application Ser. No. 60/349,524, filed Jan. 18, 2002.

BACKGROUND

Insulated gate bipolar transistors (IGBTs) are popular control devices for automobile ignition systems. The IGBT can carry large currents with very low resistance and can be rapidly switched on and off with a low voltage gate. They combine the control characteristics of DMOS devices with the current carrying capacity of thyristor.

A typical IGBT is shown in FIG. 4a. Those skilled in the art understand that some IGBTs are formed in striped cellular arrays of bases with sources. As shown in FIG. 4a, the IGBT 10 has an epitaxial layer 11 that includes two N+ source stripes regions 2a, 2b surrounded by P-typed base stripe regions 3. The portion 3a of the base 3 that lies between the source stripes is designated as the body stripe. The epitaxial layer 11 has a lightly doped N drift region 5 over a heavily doped N buffer region 7. The epitaxial layer 11 is formed on top of a heavily P doped substrate 9. On top of the device, gate insulating stripes 17, typically of silicon dioxide, cover the top of the epitaxial layer 11. Gate conductive stripes 19, typically polysilicon 19, cover the insulating stripes 17 and form a gate electrode. The gate overlies channel stripes 30a, 30b on opposite sides of the base stripe 3. Another insulating layer 21 covers the polysilicon stripes 19 and a metal contact stripe 23 contacts the source stripes 2a, 2b, N+ source contact regions 20 and the body stripe 3a of each cell. The above description is for a planar device with the gate on the surface. However, the IGBT may be fabricated with a trench gate. See FIG. 4b.

IGBTs may be used in ignition control circuits such as those shown in FIGS. 1 and 2. Those circuits are discussed in this Background portion of the specification in order to explain the invention. The location of that discussion and the discussion itself are not admissions that the circuits are prior art. When the IGBT 10 is on, it drops a low voltage $V_{CE(sat)}$ and current flows through the primary side 12 of transformer 14. The ratio of the primary to the secondary coil 16 is about 100:1. The voltage is allowed to build to about 400 volts across the primary. When the spark plug is triggered, most of the energy is discharged in the spark. If there is any residual energy, it is dissipated by an auxiliary clamp circuit 80. In FIG. 1 the clamp circuit 80a is a single pair or multiple pairs of Zener diodes 82, 84 with a cumulative breakdown voltage of about 400 volts. In FIG. 2 the clamp circuit 80b is a voltage divider including resistors R1, R2 and a single pair or multiple pairs Zener diodes 86. After the gate signal is removed, auxiliary circuits 80 keep the IGBT 10 on in order to dissipate residual energy and prevent a localized failure.

The voltage for the auxiliary circuits 80 is set by the zener diodes to dissipate the energy over time. A problem arises if there is no spark due to, for example, a broken spark plug wire or a fouled plug. That leaves an open secondary 16 and the energy remains stored in the inductors 12, 16. With the gate turned off, the energy stored in the primary 12 cannot be transferred to the secondary 16. The primary 12 forces the voltage to rise until the zeners break down. In the self clamped inductive switching (SCIS) mode a portion of the collector current, Izener, is diverted from the collector and into the gate to keep the IGBT on. Then energy stored in the primary inductor 12 will dissipate even after the gate signal is removed.

In the SCIS mode the IGBT must absorb all the energy stored in the ignition coil during abnormal operating conditions. The most common abnormal condition is an open secondary. The silicon area of the IGBT is defined by its SCIS energy density capability. Therefore, it is imperative that the SCIS energy density (mJ/cm$^2$) be increased because shrinking the silicon area reduces cost and the IGBT footprint is reduced to free up module space. A 60% reduction in the footprint can be realized by offering the same SCIS capability in the DPak (TO-252) rather than a D2Pak (TO-263). Supplying the same device performance in a DPak allows the module designer to add this functionality without increasing the module size.

In the clamping phase of the SCIS mode, a portion of the collector current is fed back to the gate after the diodes in FIGS. 1 and 2 avalanche. This current develops the required gate plateau voltage $V_{GE(plateau)}$ across the $R_{GE}$ or $R_2$ to deliver the necessary p-n-p base electron current required to conduct the total decaying current from the energy stored in the primary coil at the clamping voltage. See FIG. 3. The $V_{GE(plateau)}$ continually self adjusts because it is a function of the IGBT threshold voltage ($V_{th}$), p-n-p current gain ($\alpha_{p-n-p}$), Pbase leakage current, and channel mobility ($\mu_{ns}$). All of the above are a function of the device temperature. So $V_{GE(plateau)}$ decreases with temperature because of the following factors:

1. The $V_{th}$ voltage has a negative temperature coefficient.
2. The $\alpha_{p-n-p}$ has a positive temperature coefficient, reducing the percentage of electron current to deliver the total decaying SCIS current.
3. The electron current generated from the Pbase leakage current has a positive temperature coefficient. Refer to stripe cell cross-section shown in FIG. 4. This reduces the amount of electron current required to drift across the channel because the leakage current can supply part of the p-n-p base current.

$V_{GE(plateau)}$ increases with temperature because the degradation in $\mu_{ns}$ with increasing temperature causes a de-biasing effect.

Factors 1, 2, and 3 outweigh factor 4. So as the device 10 heats up and current decays $V_{GE\ (plateau)}$ will decrease at an accelerated rate. If $V_{GE\ (plateau)}$ reaches zero anywhere on the die while the temperature is still rising and an appreciable amount of current (>1A) is still decaying from the primary to induce localized thermal runaway, the device will fail to maintain the clamping function and may fail destructively. As such, it is desirable to find a solution for keeping $V_{GE(plateau)}$ high during SCIS clamping.

Others have tried to extend the SCIS capability by decreasing the cell pitch to more uniformly distribute the heating during SCIS by reducing the localized current density. In some designs the cell is full channel and N+ channel doping is contacted along the entire length of the stripe as showed in FIG. 5. With such designs, $V_{GE}$ (plateau) during SCIS is reduced because the electron current density per unit channel width is reduced. Thus, such designs fail to improve SCIS performance. Another design to improve SCIS performance relies upon dividing the channel width into multiple segments as shown in FIG. 6. The channel width is reduced by excluding the N+ channel doping. This can be accomplished by a simple lithographic bar pattern with the results shown in the bottom half of FIG. 6. The N+ doping need not be continuous across the contact opening as shown in the top half of FIG. 6. The segments of the channel can be connected in their centers or at their ends. See the versions showed in FIGS. 7 and 8. In both figures, contact is made again along the full length of the N+ channel doping.

The N+ contact areas are not required, nor must they be continuous across the contact opening. These methods increase $V_{GE(plateau)}$ and the electron current density per unit channel width. The higher electron current per unit channel width increases the maximum peak temperature before all the IGBT p-n-p base current can be supplied by the increasing Pbase leakage current.

SUMMARY

The invention improves SCIS performance by altering the structure of the source contact regions and by altering the structure of the sources. In particular, channel resistances are added to the device in order to more effectively distribute the heat across the surface of the die. The construction of the IGBT is altered so that contact to the source stripes is made only substantially through the source contact regions. As such, prior art techniques that relied upon contacting the source stripes along their entire length are not used. The portion of the source stripe adjacent the body region is either excluded from doping or is suitably shielded by an insulating layer. The invention also divides source stripes along the width of the channel into a plurality of segments. These segments may be of equal length and opposite each other and connected at their middles by a source contact region. In another embodiment the source stripe segments may be jogged with respect to each other so that the source contact region connects the head of one segment to the tail of another segment on the opposite side of the body stripe.

The invention provides an insulated bipolar transistor device (IGBT) that has a substrate heavily doped with a first dopant of one polarity, conventionally P-type doping. Above the substrate are buffer and drift layers typically comprising N-type dopants. The buffer layer is heavily doped and adjacent the substrate. The drift layer is more lightly doped and extends to the surface of the device. The surface of the device has a number of elongated base stripe regions formed with P-type dopants. Each base stripe region is bordered by the drift layer and extends along a length of the surface. The IGBT has numerous base stripes. Within each of the base stripes there are first and second source stripes. The source stripes are typically formed with N-type dopants and are located opposite each other and near the edges of their base stripe. The source stripes are essentially parallel to each other and extend in the same direction as the base stripes. A region in the base stripe and between the source stripes define a body stripe of P-type dopant. Portions of the base stripe between the source stripes and the proximate bordering drift layer define channel regions for the IGBT. A gate electrode is over each channel. The gate electrodes include gate oxide stripe, a conductive gate stripe and an insulating layer over the conductive gate stripe. A source contact layer, typically of metal, extends through vias in the insulating layer. The vias are at a number of locations aligned with the polysilicon gate and body stripe. The source contact layer fills the vias in the insulating layer and makes contact to a number of source contact regions. The source contact regions are typically heavily N-doped and are disposed in the body stripe. The source contact regions extend from the body stripe to one or both of the source stripes and are in electrical contact with the source contact layer. The insulating layer covers the portions of the source stripes that are proximate the body regions. Thus, the only contact to the source stripes is through the source contact regions.

In one embodiment, the source stripes are continuous and are periodically interconnected by source contact regions. The source contact regions and the source stripes may have the same heavy N-type doping. As an alternative, their stripes may have less of an N-type doping concentration. The invention also divides the source stripes into a plurality of elongated source segments comprising head and tail sections and elongated bodies. The source segments are spaced from each other along opposite sides of the body stripe. Portions of the body region extend between sequential head and tail sections of the segments in order to separate the sequential source stripe segments from each other. In one embodiment the source segments are the same length and are connected together at approximately the middle of their lengths by an source contact region. In another embodiment, the source stripes on either side of the body region are jogged with respect to each other. In that embodiment, the head of a source stripe on one side of the body stripe is connected across the body to the tail of another source stripe on the opposite side of the body stripe by a source contact region.

DRAWINGS

FIG. 15 is a partial expanded plan view of the invention in a trench gated IGBT with channel resistors along the width of the gate.

FIG. 16 is a partial expanded plan view of the invention in a trench gated IGBT with segmented sources contacted at their middles.

DETAILED DESCRIPTION

Figure 1:
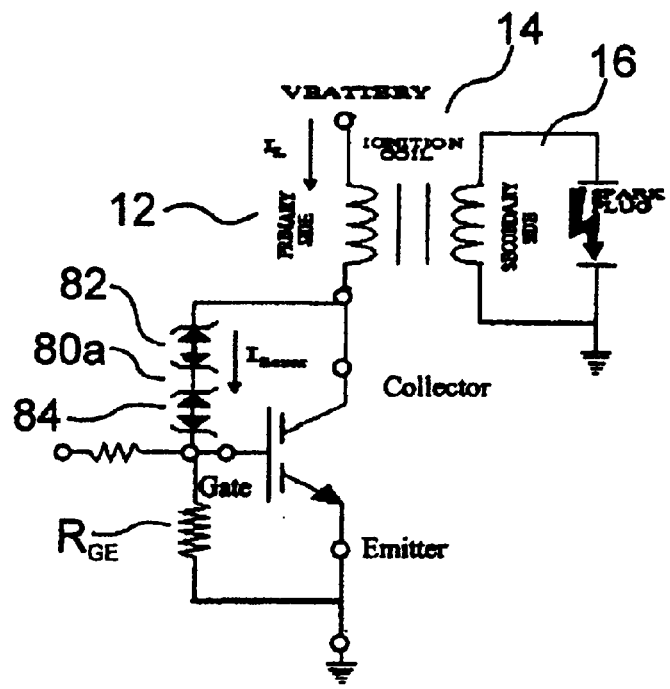
FIGS. 1 and 2 are circuit diagrams of IGBT driver circuits for automobile ignitions.
Figure 2:
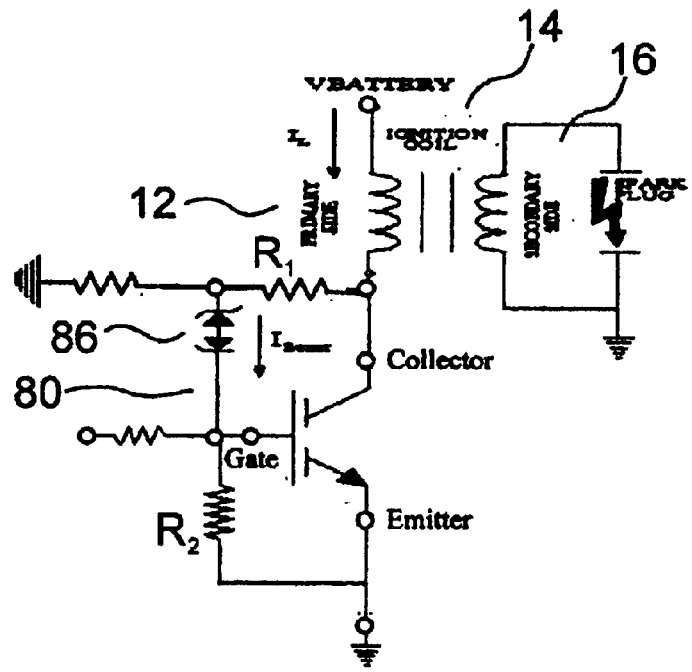
Figure 3:
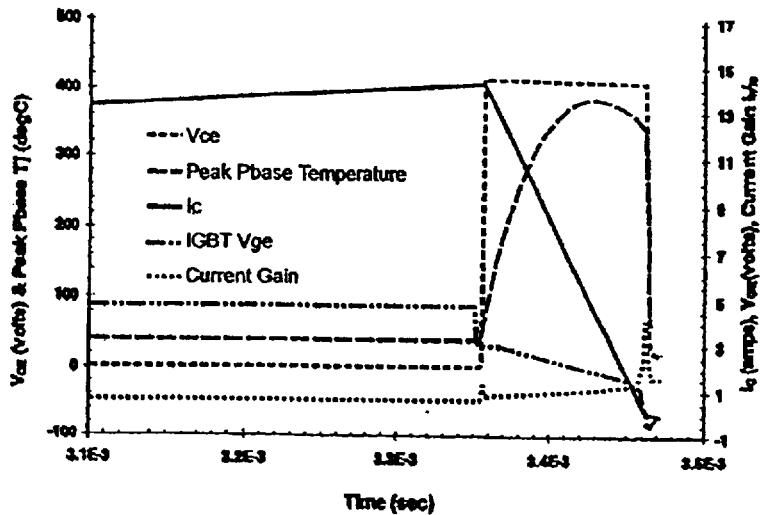
FIG. 3 is a graphic representation of operation of the IGBT before and during SCIS mode.
Figure 4A:
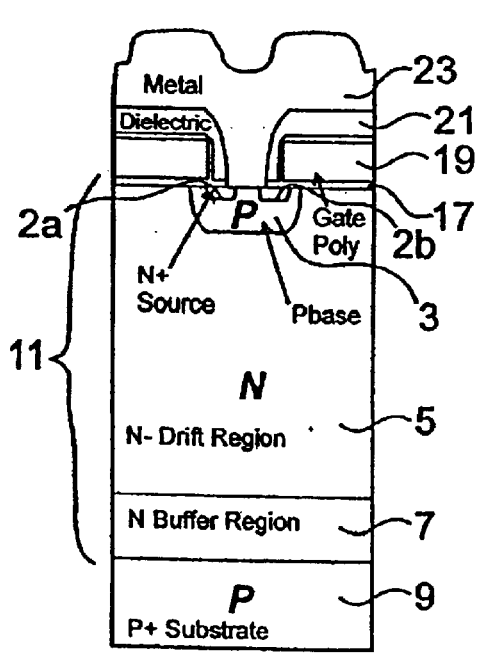
FIGS. 4a, 4b show conventional surface gate and trench gate IGBTs.
Figure 4B:
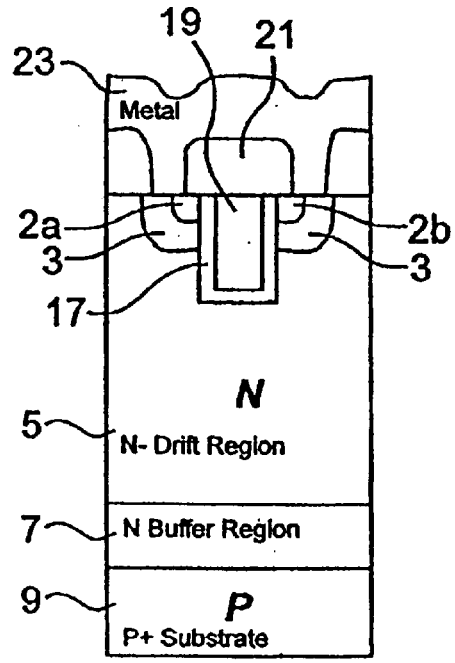
Figure 4C:
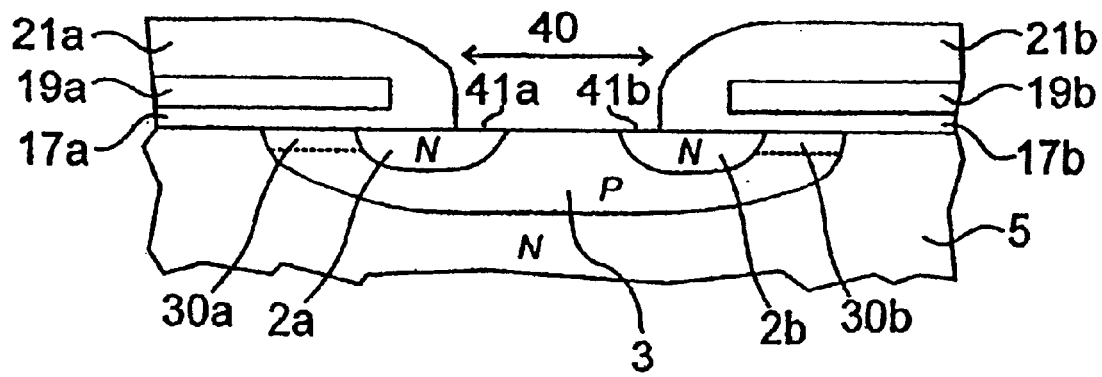
FIGS. 4c, 4d show expanded partial cross section and perspective views of a conventional surface gate IGBT.
Figure 4D:
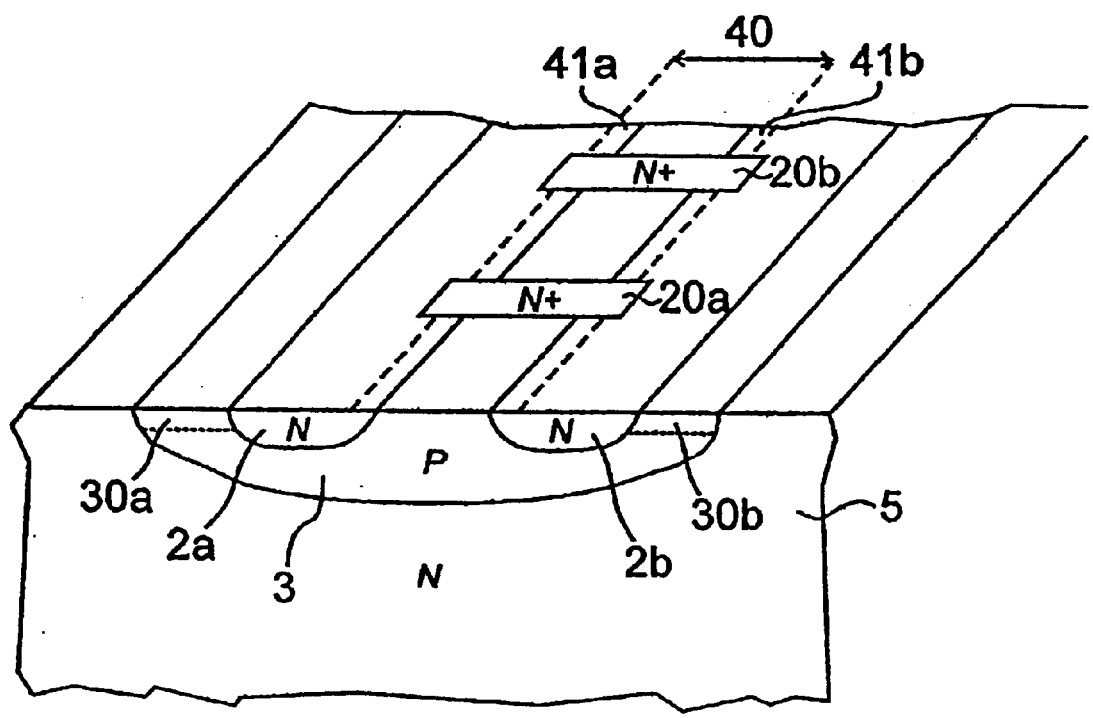

Details of the structure of typical prior art devices are shown in FIGS. 4c and 4d. Those figures show two source stripes 2a, 2b within base strip 3. The gate electrodes 19a, 19b overly portions of the gate stripes to 2a, 2b and outer portions of the base stripe 3. The electrodes 19a, 19b induce channels 30a, 30b between the outer edges of the source stripes 2a, 2b and the drift layer 5. Dielectric stripes 21a, 21b enclose the upper portions of the gates 19a, 19b and have vias 40 for source contact metal. In a conventional IGBT the source contact metal 40 makes electrical and mechanical contact with source contact diffusion regions 20a, 20b, . . . 20n as well as inside portions of the source strips 2a, 2b. Note that the inside portions designated 41a, 41b are contacted by the source metal 23.

Figure 5:
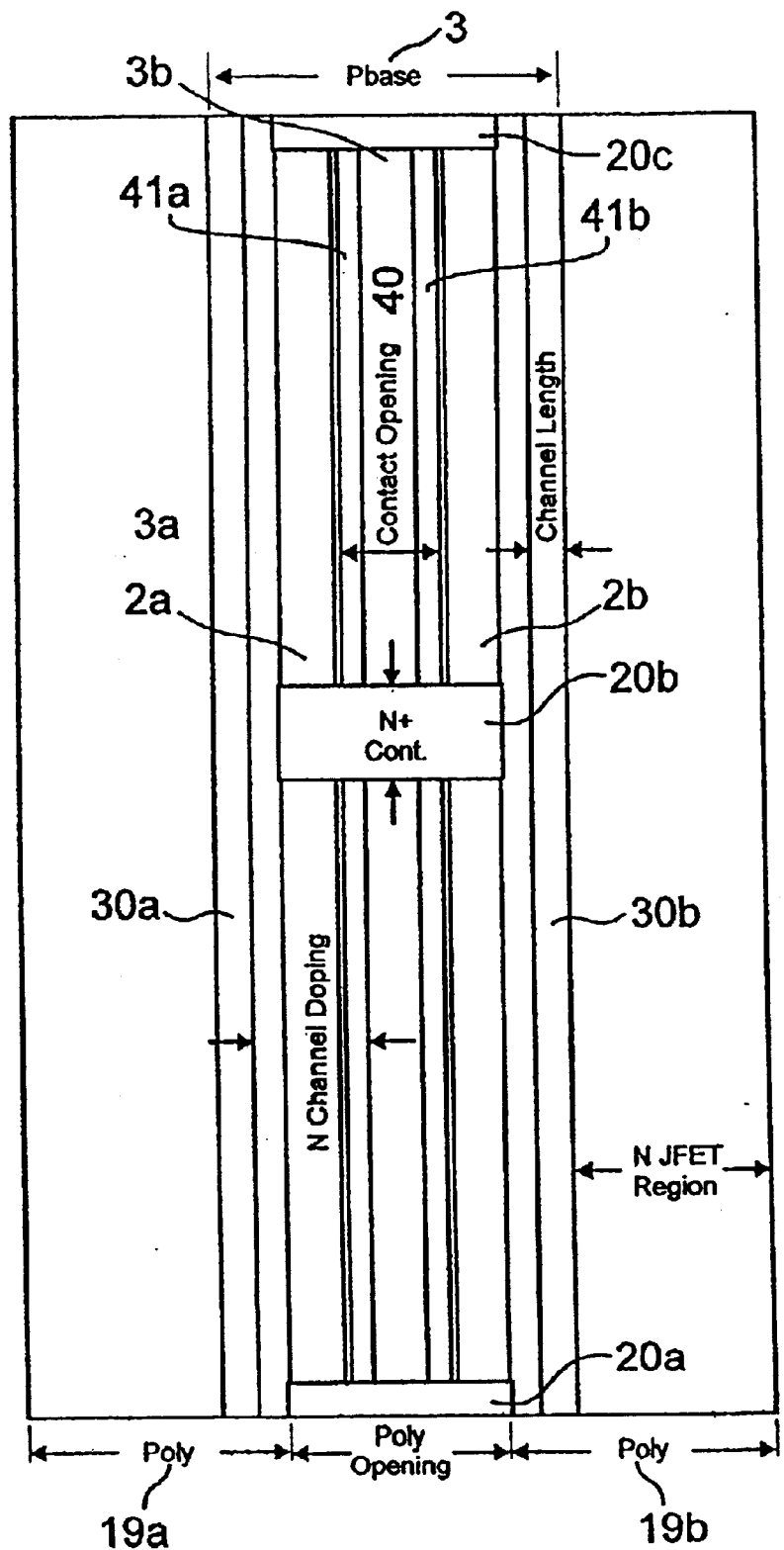
FIG. 5 is a detailed expanded plan view of a conventional IGBT stripe cell.

FIG. 5 is a detailed plan of a portion of a stripe cell in the structure as illustrated in FIGS. 4a, 4c and 4d. The central portion shows two channel stripes 2a, 2b in base stripe 3 that are separated by portion 3a of the base stripe. N+ contact regions 20a, 20b, 20c are shown. Likewise, the source metal contacted regions 41a, 41b of the source stripes 2a, 2b are also shown. The source metal makes contact with the exposed portions of the N+ contact regions 20 and the portions 41a, 41b of the stripes 2a, 2b. Thus, the entire width of the channel is contacted by the source metal. That structure does not improve SCIS performance.

Figure 6:
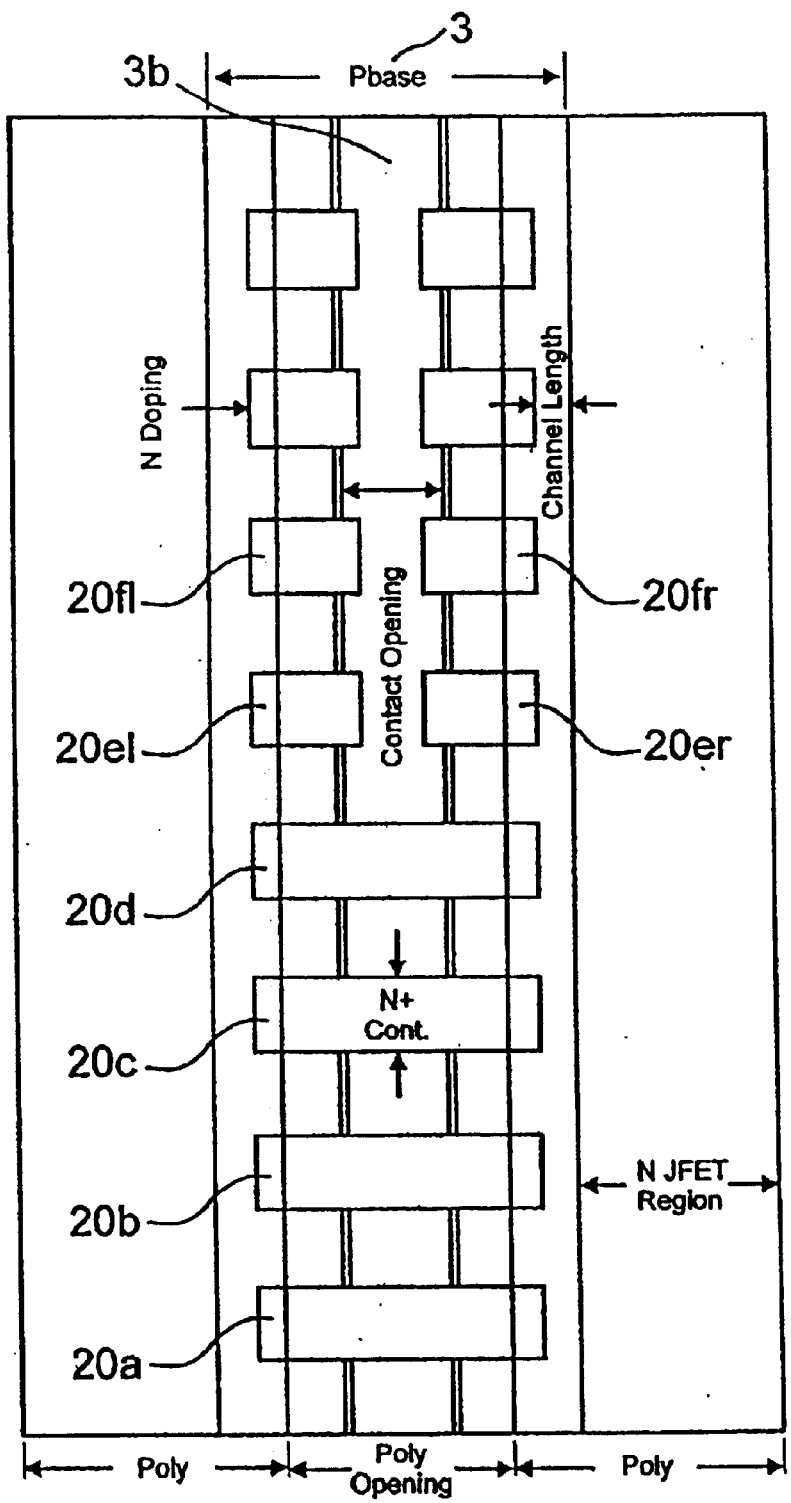
FIG. 6 is a detailed expanded plan view of a conventional IGBT with source excluded sections.

FIG. 6 shows one attempt to improve performance of the IGBT by dividing the source stripes into numerous source contact regions 20. Some of these regions extend across most of the base 3 to provide channel regions. See for example source contact regions 20a–20d. Other source contact regions such as 20el and 20er are spaced on opposite sides of the base stripe. It is not necessary that the source contact regions 20 be continuous across the base stripe 3. The structure shown in FIG. 6 is formed by providing a suitable mask that will exclude N+ source regions from undesired areas and leave only the Pbase 3 in those areas.

Figure 7:
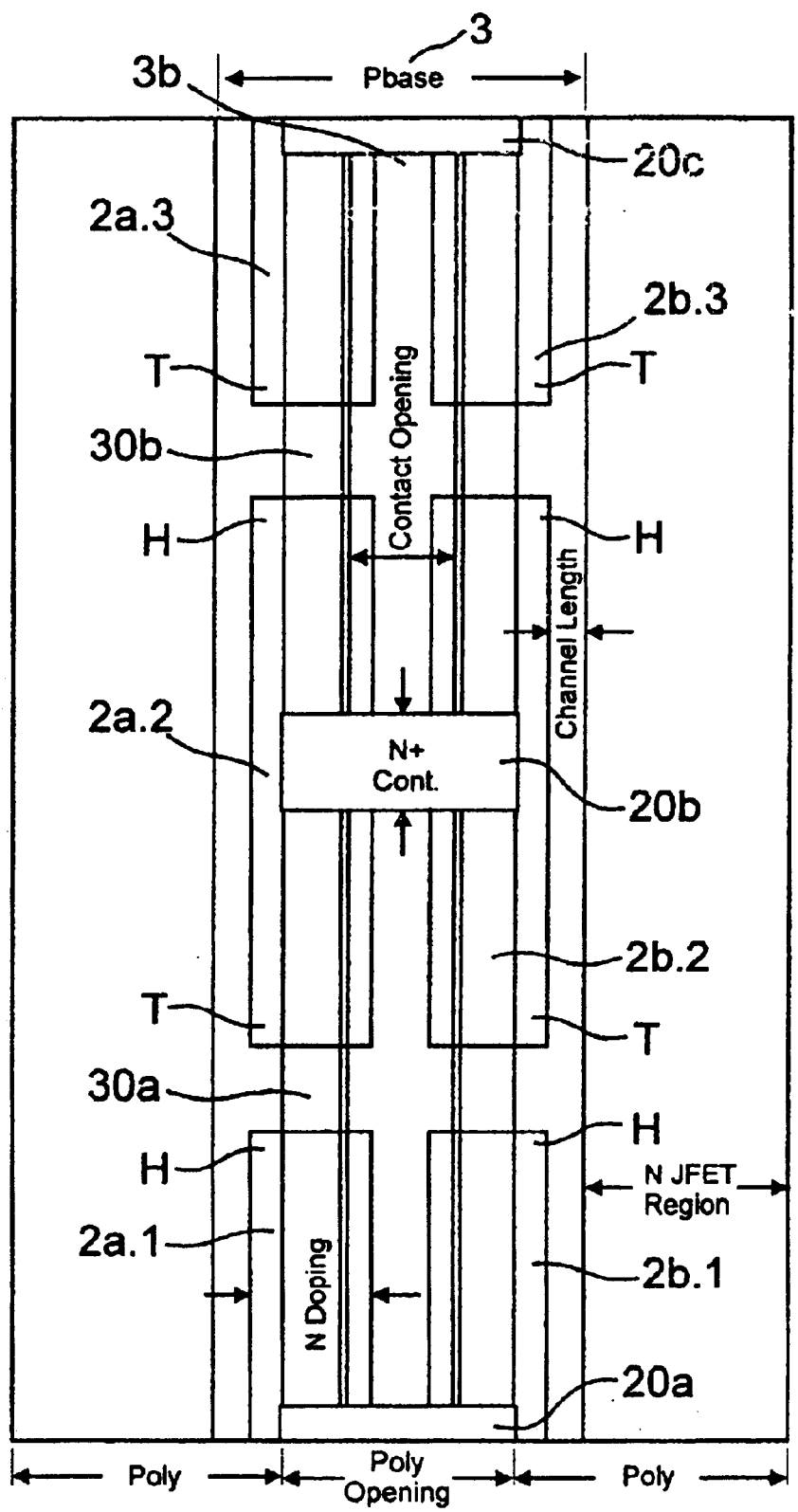
FIG. 7 is a detailed expanded plan view of an IGBT stripe cell with source segments connected at their middles.
Figure 8:
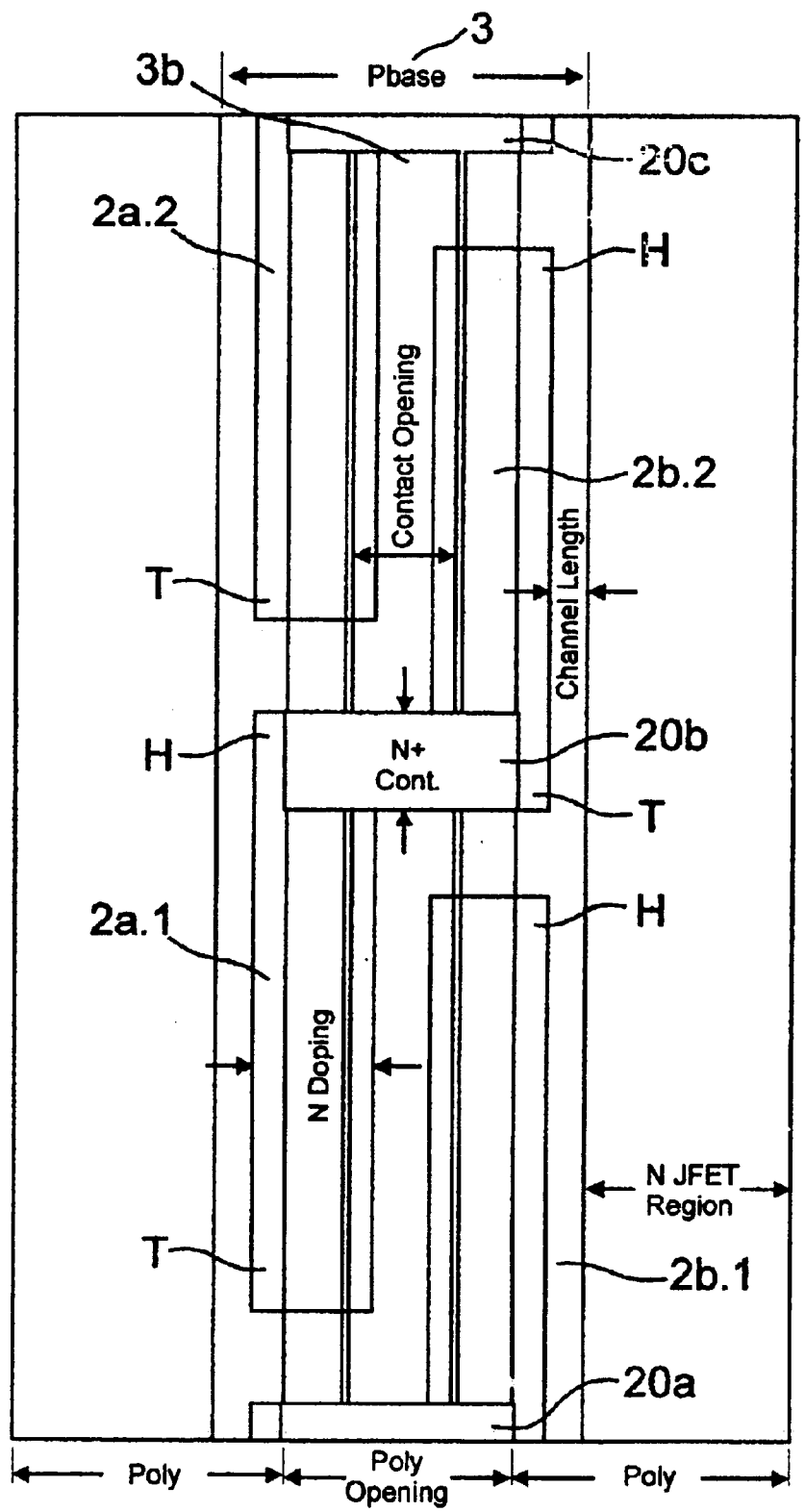
FIG. 8 is a detailed expanded plan view of an IGBT stripe cell with source segments connected head to tail.

FIGS. 7 and 8 show further examples of speculative structures that can be made with prior art techniques. No admission is made in this application that FIGS. 7 and 8 are, per se, prior art. One could divide the source stripe 2 into a plurality of segments such as 2a.1 that is opposite segment 2b.1 and segment 2a.2 that is opposite segment 2b.2 . . . 2a.n opposite 2b.n. Each of the pairs of segments 2a.n, 2b.n are connected near the middle of their length by a heavily doped N+ contact 20. As such, N+ contact 20b connects source segments 2a.2 and 2b.2. The regions 30a, 30b, . . . 30n between the heads (H) and the tails (T) of the sequential source segments are P-doped as is the Pbase. A jogged or z-type structure is shown in FIG. 8. There, the head of a striped segment on one side is connected to the tail of the next sequential source stripe on the opposite side of the base 3. So, the head of source stripe segment 2a.1 is connected via N+ contact region 20b to the tail of source stripe segment 2b.2.

Figure 9:
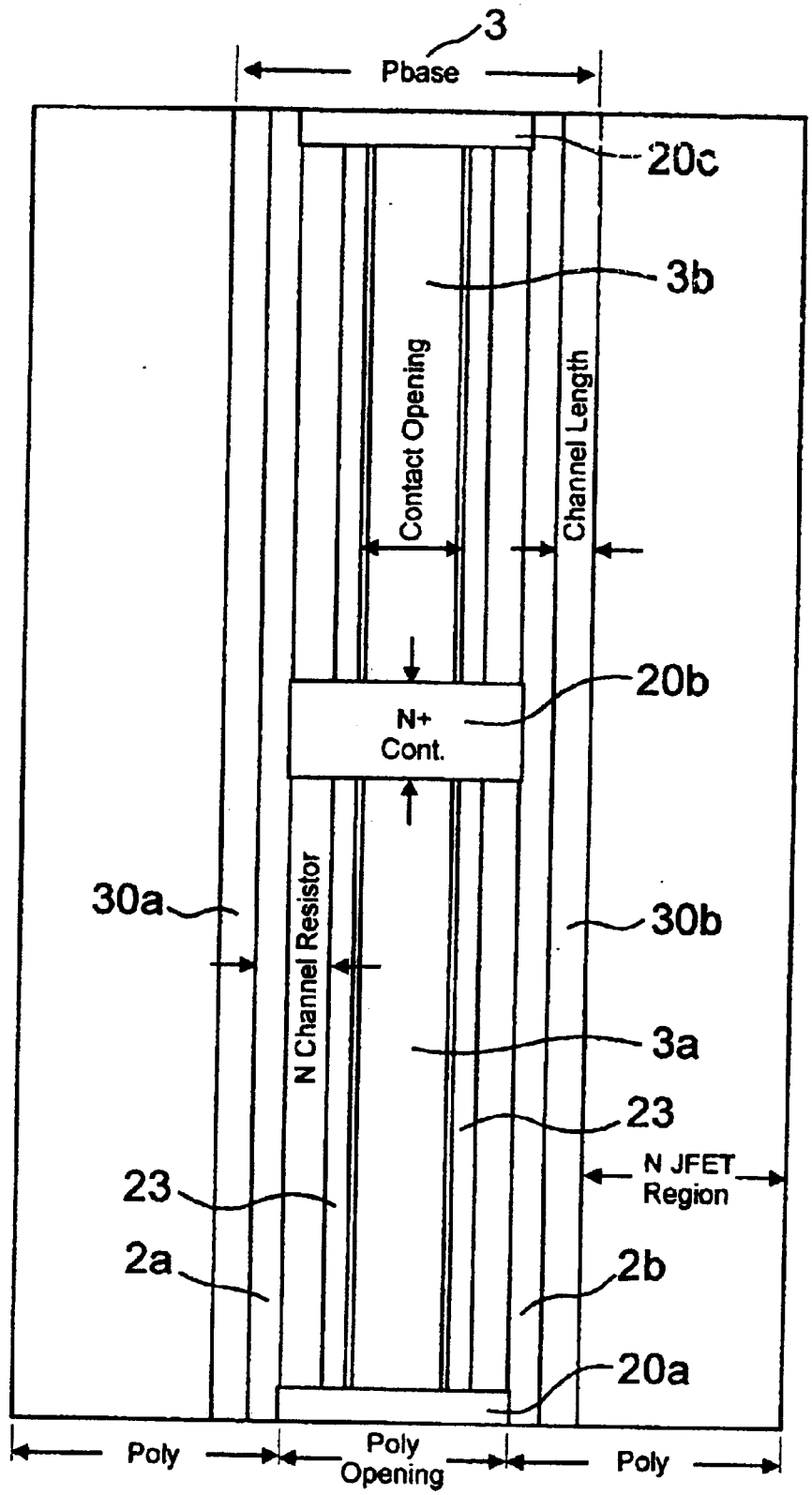
FIG. 9 is a detailed expanded plan view of an IGBT with channel resistances.
Figure 10:
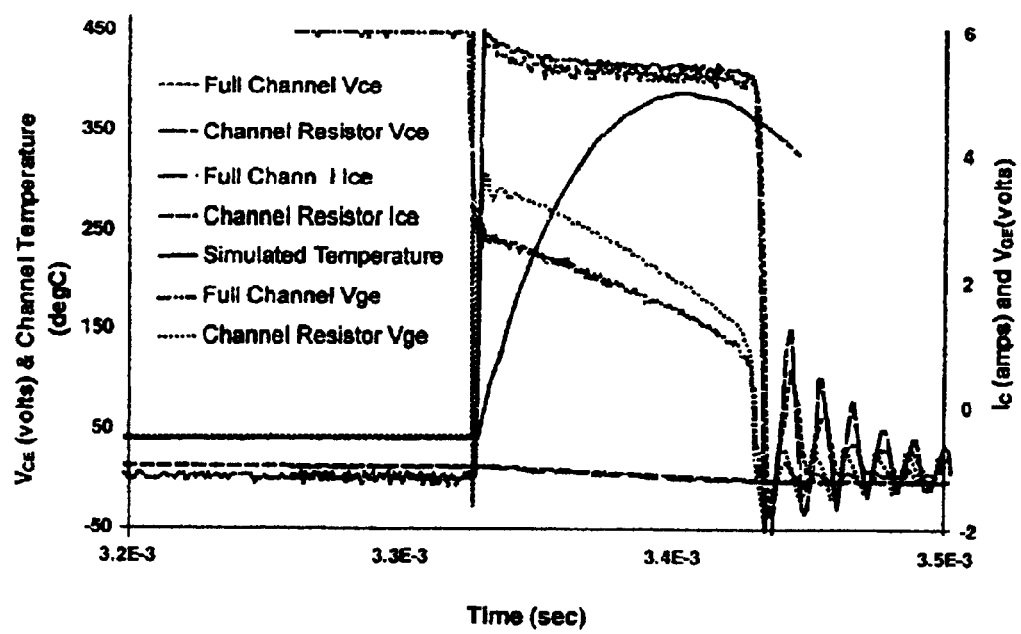
FIG. 10 is a set of graphs comparing selected characteristics of the performance of a device made in accordance with FIG. 5 to those of a device made in accordance with FIG. 14.

The invention overcomes the problems of the prior art by isolating the source stripes from the source metal contact to increase the resistance of the channel along the width of the channel. In the embodiment shown in FIG. 9, these results are achieved by narrowing the source stripes 2a, 2b or extending the dielectric 21a, 21b so that the source stripes are entirely disposed beneath the dielectric layers 21a, 21b and are not contacted by the source metal 23. As such, the only contact to the source stripes 2a, 2b is through the periodic source contact regions 20. The stripes 2a, 2b remain continuous along the length of the base stripe 3. The source stripes on opposite sides of base stripe 3 are periodically connected together by N+ contact regions 20. That structure provides channel resistance along the width of the source stripes 2a, 2b. The resistance between two sequential contact areas 20a, 20b is greatest in the middle. As such, the channel resistors concentrate current near the source contact regions 20. The wider the spacing between the contacts 20, the larger the resistive drop to the midpoint between two N+ contacts 20 and the higher the N+ source contact resistance due to reduced contact area. The N+ contacts can be continuous across the contact opening or extend partially across as shown in the top portion of FIG. 6. The channel resistors function to locally offset decreases in $V_{GE}$ (plateau) by constricting the flow of the electron current to smaller areas as the temperature increases due to the positive temperature coefficient of the resistor. While the larger spacings (50 um or greater) between N+ contacts further offset the decrease in $V_{GE}$ (plateau) due to the increased contact resistance. When temperature rises in a certain area of the die due to SCIS induced self-heating, the voltage drop down the length of the local resistor and at the N+ contacts increases. The highest voltage drop is furthest from the N+ contact. Thus, a gradual de-biasing of the gate occurs along the channel resistor to the N+ contact. At room temperature, the de-biasing effect is small. An electron current flows through the channel almost uniformly down the length of the resistor. However, as the temperature increases and the current continues to decay, the conduction of the electron current through the channel starts to constrict along the entire channel resistor length to smaller areas directly across from the N+ contacts 20. This effectively reduces the channel width of the IGBT. The reduction in effective channel width of the IGBT forces the gate to maintain a higher bias to pass the total current. The effect of this structure is demonstrated in FIG. 10.

Figure 11:
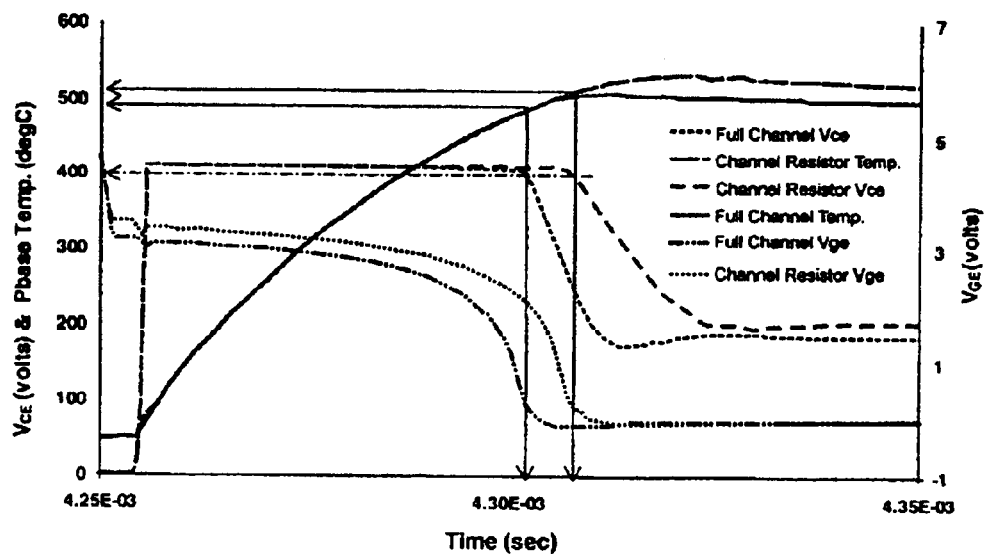
FIG. 11 is another set of graphs comparing Pbase temperature and voltage characteristics of devices made in accordance with FIGS. 5 and 9.
Figure 12:
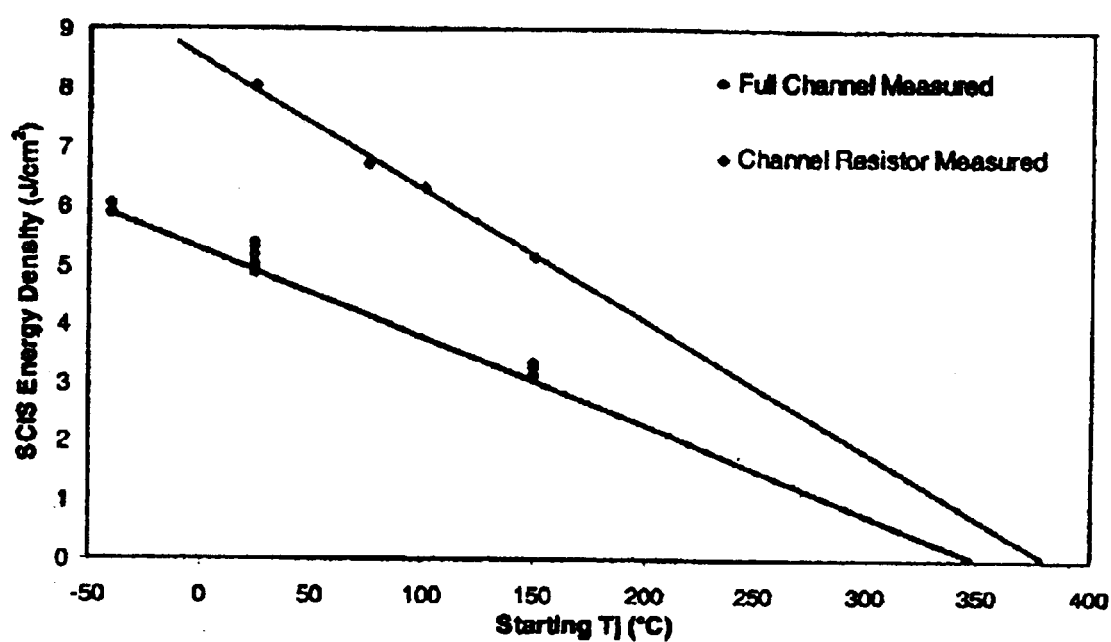
FIG. 12 is a graph comparing the SCIS energy of a device made in accordance with FIGS. 5 and 14.

There the $V_{GE}$ (plateau) of the full channel design (FIG. 5) decays linearly. However, the $V_{GE}$ (plateau) is higher for the channel resistor design and has a nonlinear decay because the electron current is constricted as the temperature increases. The constriction of electron current into these smaller areas increases the maximum peak temperature before all the IGBT p-n-p base current can be supplied by the increasing Pbase leakage current. When this occurs, the IGBT gate control is lost, thermal runaway occurs, and the clamping function fails. This is demonstrated by the simulated wave forms in FIG. 11. Although the increase in channel resistance due to the temperature effect was not modeled, the simulations show that the device must reach 30° C. to 40° C. higher peak Pbase temperature for the clamping function to fail on the device with the channel resistance invention compared to the full channel device of FIG. 5. The temperature difference would be higher with the channel resistance temperature affect included. The measured comparison in SCIS energy density improvement as a function of starting junction temperature at the initiation of the SCIS mode is shown in FIG. 12. There it can be seen that the SCIS energy density is uniformly higher for the channel resistor as compared to the full channel for all temperatures.

Figure 13:
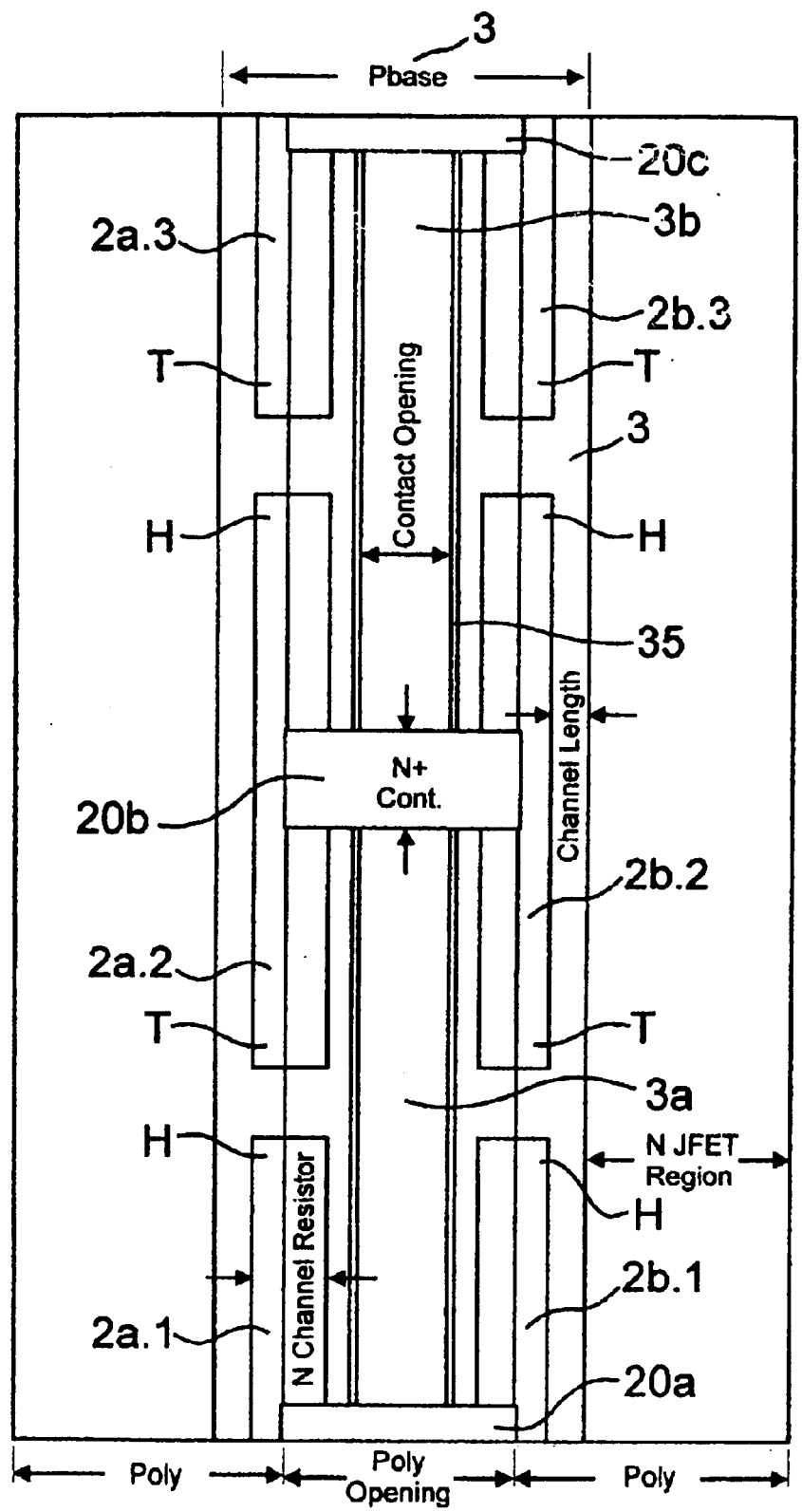
FIG. 13 is a detailed expanded plan view of an IGBT stripe cell with channel resistances and source segments connected at their middles.
Figure 14:
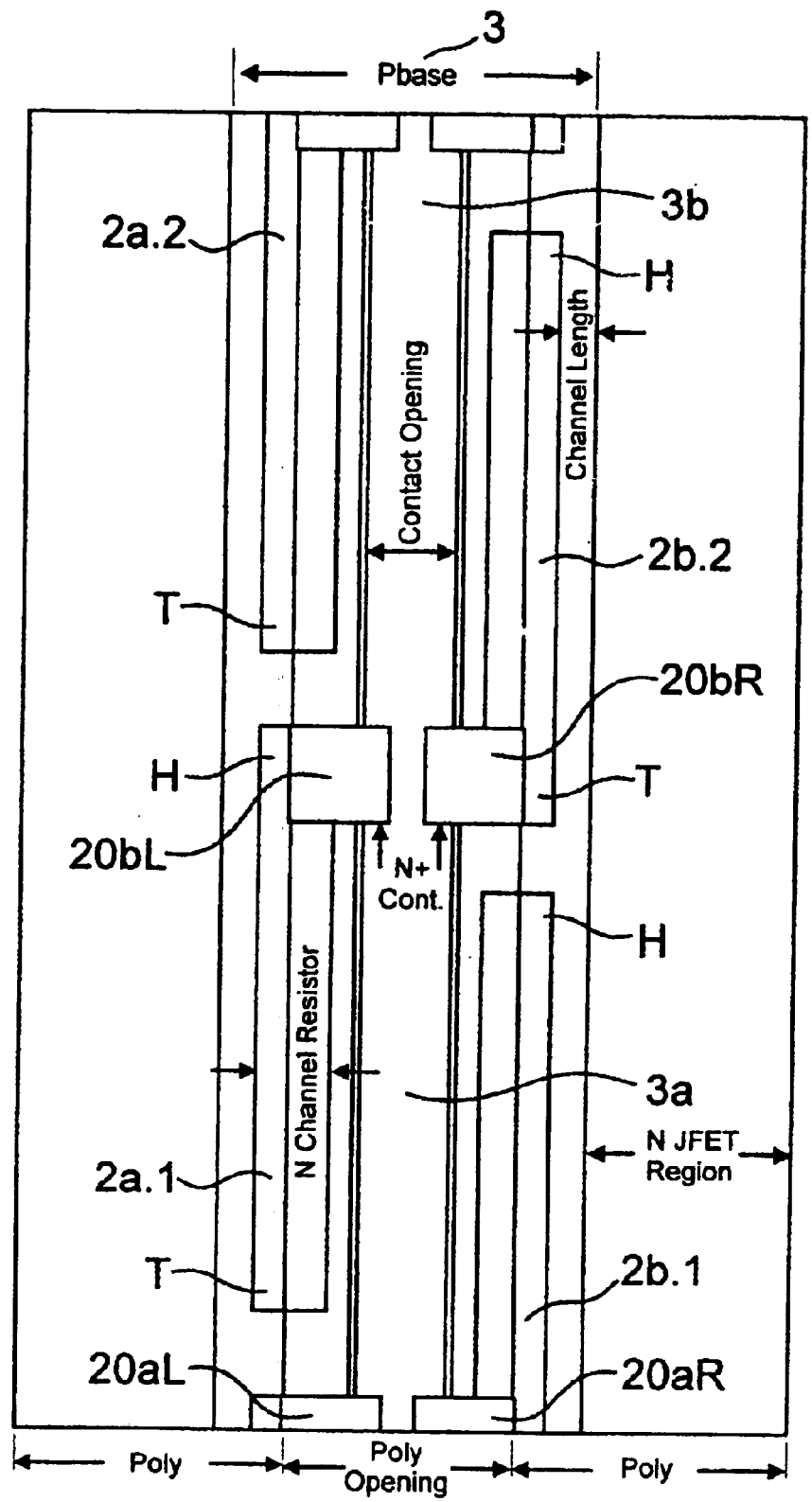
FIG. 14 is a detailed expanded plan view of an IGBT stripe cell with channel resistances and source segments connected head to tail.

The invention can also be applied to segmented source structures. Examples of the invention of such structures are shown in FIGS. 13 and 14. FIG. 13 has the source segments 2a and 2b disposed on opposite sides of the base stripe 3 and separated by the body 3a. Note: that the contact opening is sized with the narrower source stripes 2a, 2b so that only the source contact regions 20 are available for contact. The heads and tails of sequential sources are separated by the Pbase region 3.

FIG. 14 adapts a z-shaped structure to the invention. There the source stripes 2a are jogged with respect to the source stripes 2b. As such, the head of one source stripe 2a.1 terminates at about a location where an opposite, jogged source stripe tail of 2b.2 begins. The source stripes are connected by N+ contacts 20a.1, 20a.2. As mentioned above, the contact may be continuous or may be interrupted. Either structure is suitable for the invention.

Figure 17:
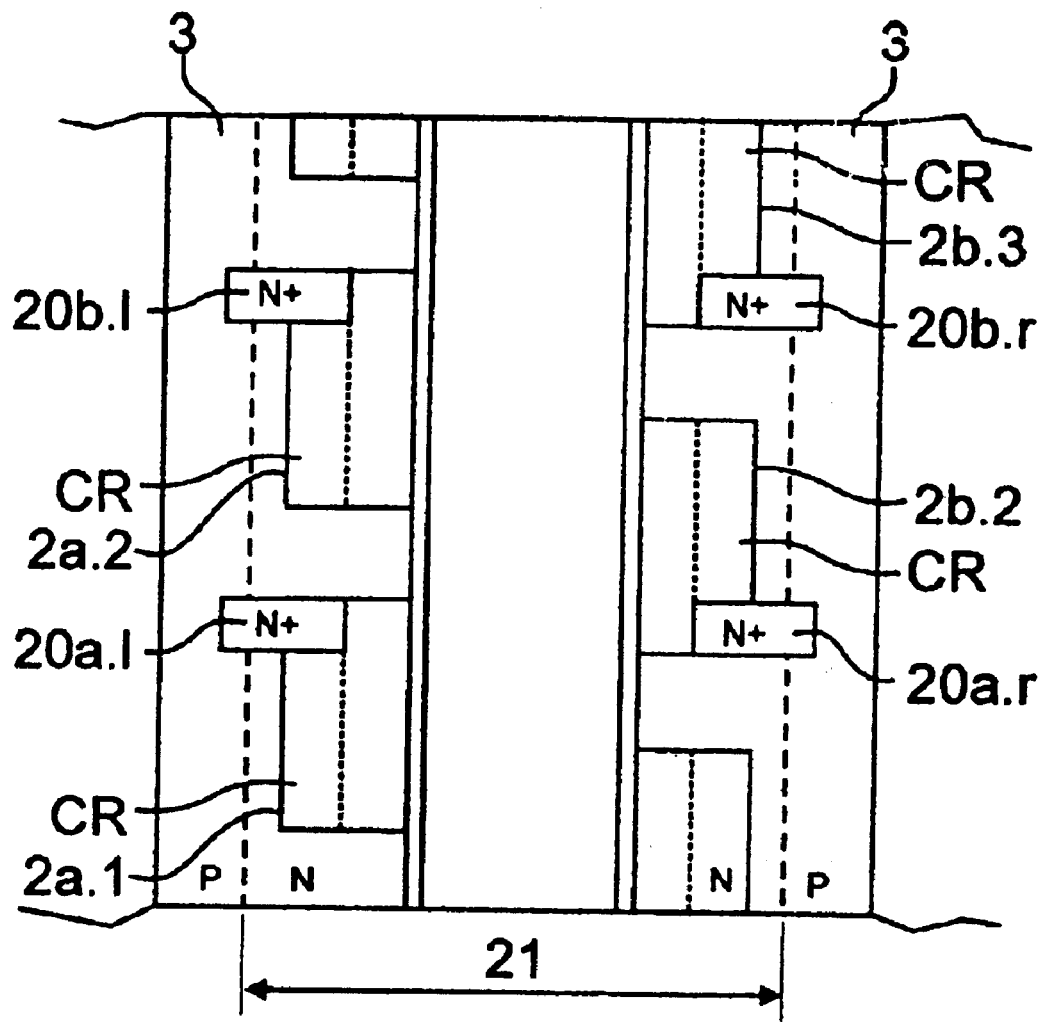
FIG. 17 is a partial expanded plan view of the invention in a trench gated IGBT with segmented sources contacted at their respective heads and tails.

Having thus described the invention and several embodiments thereof, those skilled in the art will appreciate that further modifications, additions and omissions of elements may be made to the invention without departing from the spirit and structure as set forth in the claims. In particular, the invention can be adapted to trench gated IGBTs such as the samples shown in FIG. 4b. Turning to FIG. 15, the invention is showed in a trench gated IGBT. The gate polysilicon 19 is in the middle. Source stripes 2a, 2b and base stripes 300a, 300b are separated by the gate oxide 18 that cover the walls of the trench. The insulating layer 21 extends over the gate, over the source stripes 2a, 2b and over a portion of the base stripes 300a, 300b. Source contact regions 20nl and 20nr contact the source stripes 2a, 2b on opposite sides of the gate trench. Channel resistances CR are formed in the portions of the source stripes between the contact regions. This embodiment of the invention is similar to the planar gate embodiment shown in FIG. 9. FIGS. 16 and 17 show other trench gate embodiments that are similar respectively to the planar embodiments showed in FIGS. 13 and 14, respectively. In FIG. 16 selected portions of the source stripe are excluded to form source segments of equal length. The segments on opposite sides of the trench are contacted. In FIG. 17 source segments are jogged with respect to each other. Segments on opposite sides of the trench have source contacts at opposite heads and tails.

Those skilled in the art will understand that the invention may be embodied in other configurations. For example, the lengths of the channel resistors may be different depending upon their location. In general, shorter lengths closer to the center of the die are preferred. In addition opposing segments of the embodiment shown in FIGS. 13, 14 and 15, 16 do not have to be the same length. Similar results can be achieved by masking and doping the source stripes and source segments to alter the resistance of the channel resistors. Those skilled in the art also understand that the base stripes may be connected together at their ends to form a common base for the device.

Figures 18A, 18B:
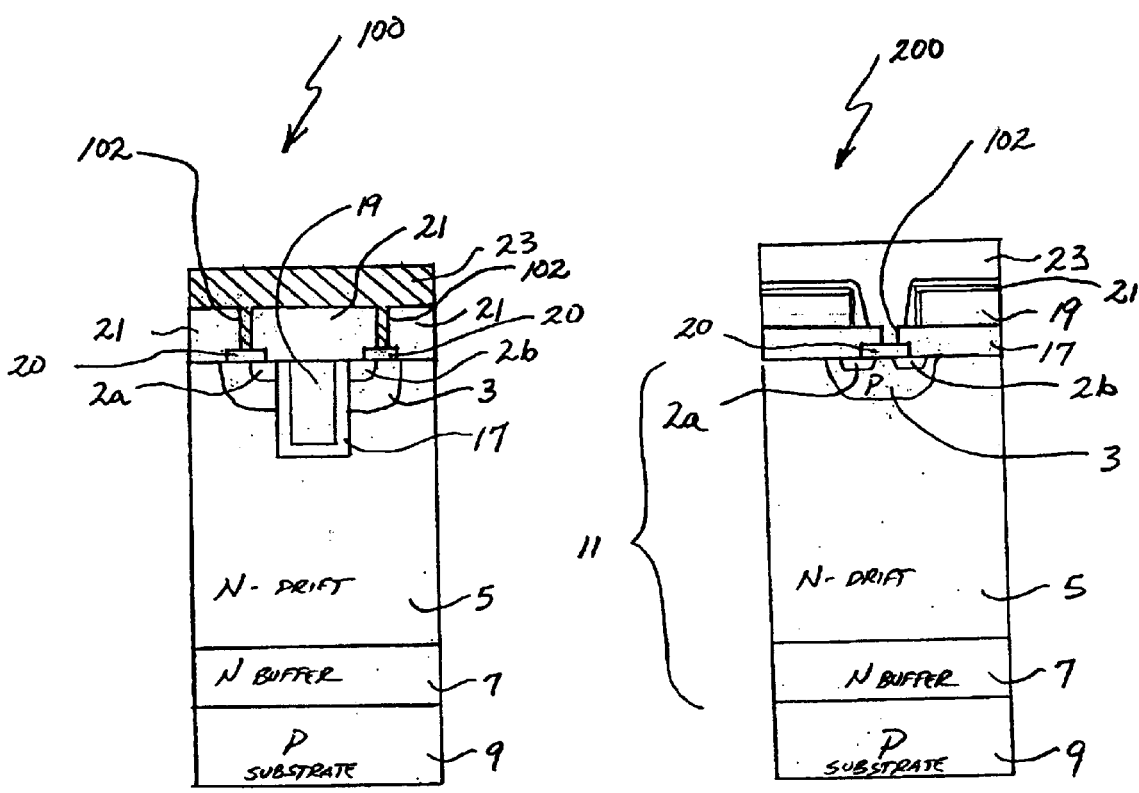
FIGS. 18a and 18b are cross-sectional views of one embodiment of a trench-gated and surface-gated IGBTs of the present invention.

Referring now to FIG. 18a, one embodiment of a trench-gated IGBT of the present invention is shown. IGBT 100 includes a plurality of N+ source contact regions 20 (only two of which are shown) that extend between the base regions 3 and source strips 2a and 2b, which are spaced apart along the length of the base stripes 3 and source stripes 2a, 2b. Insulating layer 21, in this embodiment, entirely covers the trench gate 19 and source strips 2a and 2b. A plurality of vias 102 (only two shown) are formed in known manner through insulating layer 21 over source contact regions 20. Source contact layer 23 is disposed over the insulating layer 21, and extends through vias 102 to thereby contact the source contact regions 20.

Referring now to FIG. 18b, one embodiment of a surface-gated IGBT of the present invention is shown. IGBT 200 includes a plurality of N+ source contact regions 20 (only one shown) that extend between the body stripe and the source stripes 2a, 2b, and which are spaced apart along the length of the base stripes 3 and source stripes 2a, 2b. Insulating layer 17 in this embodiment, entirely covers source stripes 2a and 2b. A plurality of vias 102 (only one shown) are formed in known manner through insulating layer 17 over source contact regions 20. Source contact layer 23 is disposed over the insulating layers 21 and 17, and extends through vias 102 to thereby contact source contact regions 20.

What is claimed is:

1. An insulated gate bipolar transistor device (IGBT) comprising:

a substrate heavily doped with a first dopant of one polarity;

buffer and drift layers doped with a second dopant of a polarity opposite to the first dopant, the buffer and drift layers located over the substrate, with the drift layer extending to a first surface, said first surface being opposite the substrate;

at least one base region doped with the first dopant, each said at least one base region bordered by the drift layer, each said at least one base region extending along said first surface to form a corresponding at least one base stripe on said first surface;

first and second source stripes doped with the second dopant and located in each said at least one base stripe, said source stripes being spaced apart from and substantially parallel relative to each other, said source stripes extending in a substantially parallel manner relative to the base stripe;

a body stripe defined between said source stripes;

first and second channel regions, each of said channel regions extending across a corresponding one of said at least one base stripe from a corresponding one of said source stripes to said drift layer in a direction away from said body stripe;

a respective gate oxide stripe over each channel region;

a respective conductive gate stripe on each gate oxide stripe for controlling current through the corresponding channel;

a respective insulating layer over each conductive gate stripe, each insulating layer entirely covering a corresponding one of the source stripes;

a source contact layer disposed at least in part between the conductive gate stripes and overlying said body stripe;

a plurality of source contact regions heavily doped with the second dopant, said source contact regions disposed in the body stripe and extending from the body stripe to at least one of the source stripes and in electrical contact with the source contact layer, said source contact regions spaced apart from each other along said body stripe and along said source stripes; and wherein said source stripes are divided into a plurality of elongate source segments spaced from each other along opposite sides of the body stripe, portions of a corresponding one of said at least one base region disposed between opposite ends of sequential segments to separate the sequential source stripe segments form each other, said source stripes having forward and rearward ends and wherein corresponding ends of source stripes disposed on opposite sides of the body stripe and jogged with respect to each other.

2. An insulated gate bipolar transistor device (IGBT), comprising:

a substrate heavily doped with a first dopant of one polarity;

buffer and drift layers doped with a second dopant of a polarity opposite to the first dopant, the buffer and drift layers located over the substrate, with the drift layer extending to a first surface, said first surface being opposite the substrate;

at least one base region doped with the first dopant, each said at least one base region bordered by the drift layer, each said at least one base region extending along said first surface to form a corresponding at least one base stripes on said first surface;

first and second source stripes doped with the second dopant and located in each said at least one base stripe, said source stripes being spaced apart from and substantially parallel relative to each other, said source stripes extending in a substantially parallel manner relative to the base stripe;

a body stripe defined between said source stripe;

first and second channel regions, each of said channel regions extending across a corresponding one of said at least one base stripe from a corresponding one of said source stripes to said drift layer in a direction away from said body stripe;

a respective gate oxide stripe over each channel region;

a respective conductive gate stripe on each gate oxide stripe for controlling current through the corresponding channel;

a respective insulating layer over each conductive gate stripe, each insulating layer entirely covering a corresponding one of the source stripes;

a source contact layer disposed at least in part between the conductive gate stripes and overlying said body stripe;

a plurality of source contact regions heavily doped with the second dopant, said source contact regions disposed in the body stripe and extending from the body stripe to at least one of the source stripes and in electrical contact with the source contact layer, said source contact regions spaced apart from each other along said body stripe and along said source stripes; and wherein said source stripes are divided into a plurality of elongate source segments spaced apart from each other along opposite sides of the body stripe, portions of a corresponding one of said at least one base region disposed between opposite ends of sequential segments to separate the sequential source stripe segments from each other, said source segments having different lengths.

3. An insulated gate bipolar transistor device (IGBT), comprising:

a substrate heavily doped with a first dopant of one polarity;

buffer and drift layers doped with a second dopant of a polarity opposite to the first dopant, the buffer and drift layers located over the substrate, with the drift layer extending to a first surface, said first surface being opposite the substrate;

at least one base region doped with the first dopant, each said at least one base region bordered by the drift layer, each said at least one base region extending along said first surface to form a corresponding at least one base stripe on said first surface;

first and second source stripes doped with the second dopant and located in each said at least one base stripe, said source stripes being spaced apart from and substantially parallel relative to each other, said source stripes extending in a substantially parallel manner relative to the base stripe;

a body stripe defined between said source stripes;

first and second channel regions, each of said channel regions extending across a corresponding one of said at least one base stripe from a corresponding one of said source stripes to said drift layer in a direction away from said body stripe;

a respective gate oxide stripe over each channel region;

a respective conductive gate stripe on each gate oxide stripe for controlling current through the corresponding channel;

a respective insulating layer over each conductive gate stripe, each insulating layer entirely covering a corresponding one of the source stripes;

a source contact layer disposed at least in part between the conductive gate stripes and overlying said body stripe;

a plurality of source contact regions heavily doped with the second dopant, said source contact regions disposed in the body stripe and extending from the body stripe to at least one of the source stripes and in electrical contact with the source contact layer, said source contact regions spaced apart from each other along said body stripe and along said source stripes; and wherein said source stripes are divided into a plurality of elongate source segments spaced from each other along opposite sides of the body stripe, portions of a corresponding one of said at least one base region disposed between opposite ends of sequential segments to separate the sequential source stripe segments from each other, and wherein said source segments having respective and predetermined lengths, said predetermined lengths being dependent at least in part upon the proximity of said source segments to a center of the IGBT die, and said predetermined lengths being relatively shorter proximate to the center of the IGBT die.

4. The IGBT of claim 3 wherein said predetermined lengths of said source segments are dependent upon a desired local SCIS current density.

5. An insulated gate bipolar transistor device (IGBT), comprising:

a substrate heavily doped with a first dopant of one polarity;

a drift layer over the substrate and doped with a second dopant of an opposite polarity, the drift layer extending to a surface opposite the substrate;

at least one base region doped with the first dopant, each said at least one base region bordered by the drift layer and extending along said surface to form a corresponding at least one base stripe on said surface of the device;

source stripes with second dopants in each of said at least one base region, a body stripe defined between said source stripes, said source stripes for forming channel regions that extend across said base stripes proximate said surface from a corresponding one of said source stripes to said drift layer in a direction away from said body stripe;

a respective insulated control gate overlying a corresponding base and source stripe over a corresponding channel region, each control gate including a gate stripe and an insulating layer, said insulating layer entirely covering a corresponding one of said source stripes;

source contact regions disposed adjacent the source stripes, said source contact regions spaced apart from each other along said body stripe and along said source stripes;

resistances formed within the source stripes between the source contact regions, said resistances constricting the flow of electron current between the drift layer and the source contact regions; and wherein said source stripes are sequentially segmented into sequential source segments, said sequential source segments being separated from each other by a portion of a corresponding one of said at least one base region said sequential source segments of opposite source stripes are jogged with respect to each other and are connected together at their opposite, jogged ends by a source contact region.

6. An insulating gate bipolar transistor device (IGBT) comprising:
   a substrate heavily doped with a first dopant of one polarity;
   a drift layer over the substrate and doped with a second dopant of an opposite polarity, the drift layer defining a surface opposite the substrate;
   a trench gate in said surface including a gate insulator disposed between the trench gate and said surface, and a conductive material adjacent the gate insulator forming a gate electrode;
   base regions disposed on opposite sides of said gate trench and being doped with the first dopant, each base region bordered by the drift layer and extending along a length of said surface to form base stripes on said surface;
   source stripes disposed between the base stripes and the trench and shallower than the base for forming channel regions along opposite sides of the trench;
   an insulating layer entirely covering the trench gate and the source stripe regions;
   a plurality of vias in the insulating layer and over the source contact regions;
   source contact regions extending between the base regions and the source stripes, said source contact regions being spaced apart relative to each other and along the base and source stripes;
   a plurality of channel resistances in the source stripes and disposed between the source contact regions; and
   a source contact layer over the insulating layer and extending through the vias therein to contact the source contact regions in the source stripes.

7. The IGBT of claim 6 wherein the base regions are connected together to form a common base.

8. An insulating gate bipolar transistor device (IGBT), comprising:
   a substrate heavily doped with a first dopant of one polarity;
   a drift layer over the substrate and doped with a second dopant of an opposite polarity, the drift layer defining a surface opposite the substrate;
   a trench gate in said surface including a gate insulator disposed between the trench gate and said surface, and a conductive material adjacent the gate insulator forming a gate electrode;
   base regions disposed on opposite sides of said gate trench and being doped with the first dopant, each base region bordered by the drift layer and extending along a length of said surface to form base stripes on said surface;
   source stripes disposed between the base stripes and the trench and shallower than the base for forming channel regions along opposite sides of the trench;
   a insulating layer entirely covering the trench gate and the source stripe regions;
   a plurality of vias in the insulating layer over the source contact regions;
   source contact regions extending between the base regions and the source stripes, said source contact regions being spaced apart relative to each other and along the base and source stripes;
   a plurality of channel resistances in the source striped and disposed between the source contact regions;
   a source contact layer over the insulating layer and extending through the vias therein to contact the source contact regions in the source stripes; and
   wherein the source stripes are sequentially segmented into sequential segments, said sequential segments are separated from each other by a portion of a corresponding one of said base regions.

9. The IGBT of claim 8 wherein source segments opposite each have source contact regions in the middle of the segments.

10. The IGBT of claim 8 wherein the sequential segments of opposite source stripes are jogged with respect to each other, sequential segments on one side of the trench have source contact regions at a head end of the segments and sequential segments on the other side of the trench have source regions at a tail end of the segments, the head ends of the one segments are opposite the tail ends of the other segments.

11. An insulated gate bipolar transistor device (IGBT) comprising:
   a substrate heavily doped with a first dopant of one polarity;
   a drift layer over the substrate and doped with a second dopant of an opposite polarity, the drift layer extending to a surface opposite the substrate;
   base regions doped with the first dopant, each base bordered by the drift layer and extending along a length of the surface to form a plurality of base stripes on the surface of the device;
   two source stripes regions disposed inside each base stripe, the source stripe regions shallower than the base for forming channel regions at a junction of the base stripe and the source stripe;
   source contact regions extending between the base regions and the source stripes, said source contact regions being spaced apart along a length of said source stripes;
   an insulating layer entirely covering the source stripes and having vias above the source contact regions;
   a source contact layer over the source stripes and in the vias for contacting the source contact regions;
   a plurality of channel resistances in the source stripes and disposed between the source contact regions;
   a gate including a gate insulator and conductive material adjacent the gate insulator forming the gate electrode, said gate disposed over the channel region formed by the base and source stripes; and
   wherein the base regions are connected together to form a common base.

12. The IGBT of claim 8 wherein the gate is a trench gate extending from the surface into the base region.

* * * * *